United States Patent
Wang et al.

(10) Patent No.: US 9,529,959 B2
(45) Date of Patent: Dec. 27, 2016

(54) SYSTEM AND METHOD FOR PATTERN CORRECTION IN E-BEAM LITHOGRAPHY

(71) Applicant: Taiwan Semiconductor Manufacturing Company, Ltd., Hsin-Chu (TW)

(72) Inventors: Hung-Chun Wang, Taichung (TW); Hsu-Ting Huang, Hsinchu (TW); Wen-Chun Huang, Tainan (TW); Ru-Gun Liu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 27 days.

(21) Appl. No.: 14/192,523

(22) Filed: Feb. 27, 2014

(65) Prior Publication Data
US 2015/0242562 A1    Aug. 27, 2015

(51) Int. Cl.
*G06F 17/50*    (2006.01)

(52) U.S. Cl.
CPC ....... *G06F 17/5081* (2013.01); *G06F 17/5009* (2013.01)

(58) Field of Classification Search
USPC .......................................................... 716/53
See application file for complete search history.

(56) References Cited

U.S. PATENT DOCUMENTS

| | | | |
|---|---|---|---|
| 2003/0093767 A1* | 5/2003 | Murai | B82Y 10/00 430/30 |
| 2008/0067446 A1* | 3/2008 | Belic et al. | 250/492.22 |
| 2012/0252215 A1* | 10/2012 | Abe | 438/694 |

* cited by examiner

*Primary Examiner* — Bryce Aisaka
(74) *Attorney, Agent, or Firm* — Haynes and Boone, LLP

(57) ABSTRACT

The present disclosure provides a method for pattern correction for electron-beam (e-beam) lithography. In accordance with some embodiments, the method includes splitting a plurality of patterns into a plurality of pattern types; performing model fittings to determine a plurality of models for the plurality of pattern types respectively; and performing a pattern correction to an integrated circuit (IC) layout using the plurality of models.

17 Claims, 6 Drawing Sheets

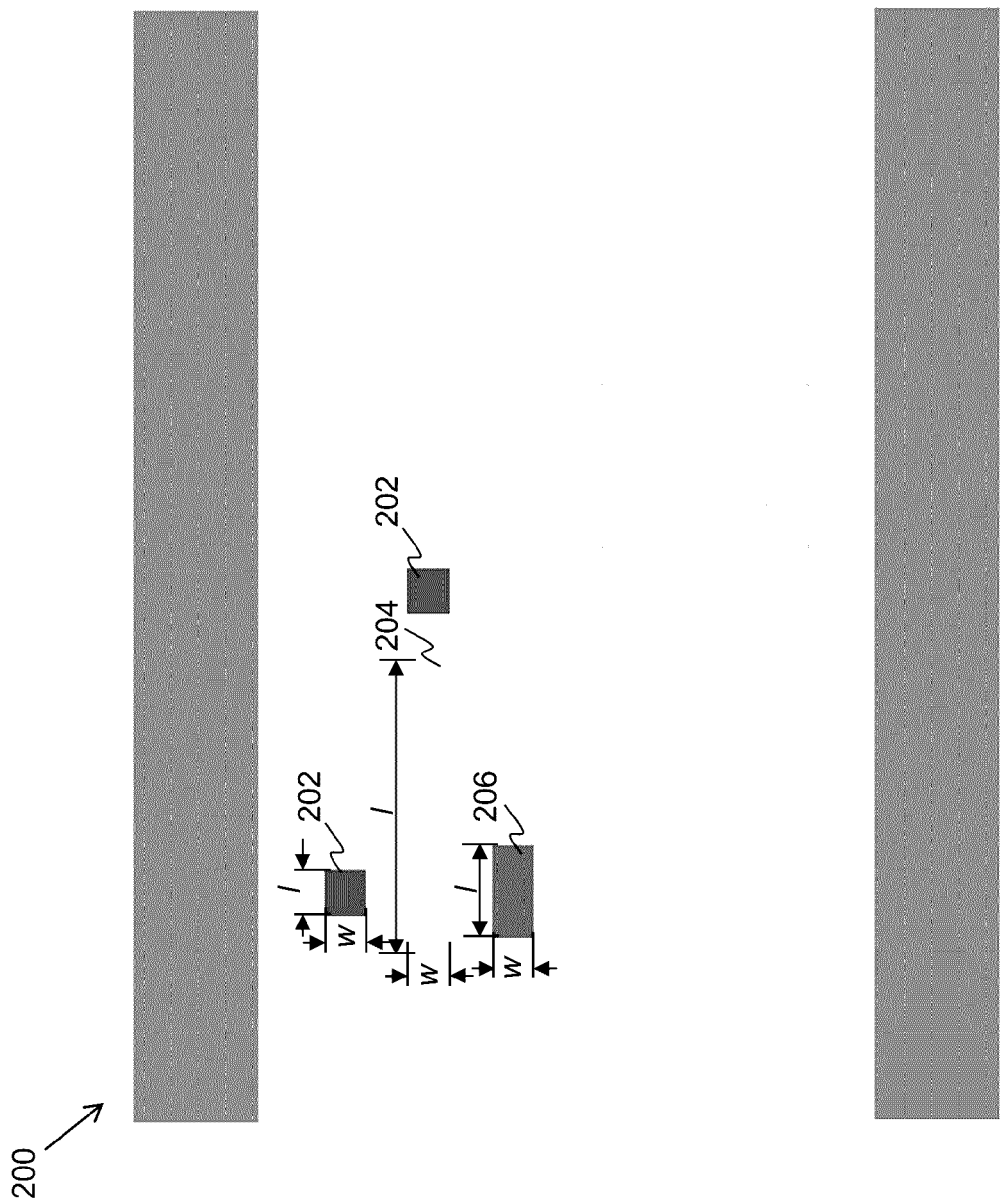

| Pattern Type | $\alpha$ | $\beta$ | $\eta$ |
|---|---|---|---|
| Square pattern 202 | $\alpha_{sq}$ | $\beta_{sq}$ | $\eta_{sq}$ |
| Slot pattern 206 | $\alpha_{sl}$ | $\beta_{sl}$ | $\eta_{sl}$ |
| Trench pattern 204 | $\alpha_{tr}$ | $\beta_{tr}$ | $\eta_{tr}$ |
| Others | $\alpha_o$ | $\beta_o$ | $\eta_o$ |

SYSTEM AND METHOD FOR PATTERN CORRECTION IN E-BEAM LITHOGRAPHY

BACKGROUND

The semiconductor integrated circuit (IC) industry has experienced rapid growth. Technological advances in IC materials and design have produced generations of ICs where each generation has smaller and more complex circuits than the previous generation. Photolithography systems are used to pattern a semiconductor wafer. When semiconductor technology continues progressing to circuit layouts having smaller feature sizes, a lithography system with higher resolution is need to image an IC pattern with smaller feature sizes. An electron-beam (e-beam) system is introduced for lithography patterning processes as the electron beam has wavelengths that can be tuned to very short, resulting in very high resolution.

To enhance the imaging effect when a design pattern is transferred to a wafer, an electron proximity correction (EPC) to minimize the proximity effect is indispensable. The design pattern is adjusted to generate an image on the wafer with improved resolution. However, along with the progress of the lithography patterning, some other imaging effects are unavoidable and those imaging factors may be pattern related. Those other imaging factors are not fully considered and not effectively corrected or efficiently corrected. Therefore, it is desirable to have a system and a method for improved e-beam lithography in IC fabrication to address the above issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A illustrates various exemplary polygon shapes of the patterns, in accordance with some embodiments of the present disclosure.

FIG. 2B illustrates an exemplary table showing different coefficients α, β, η for respective pattern types, in accordance with some embodiments of the present disclosure.

DETAILED DESCRIPTION

Figure 1:
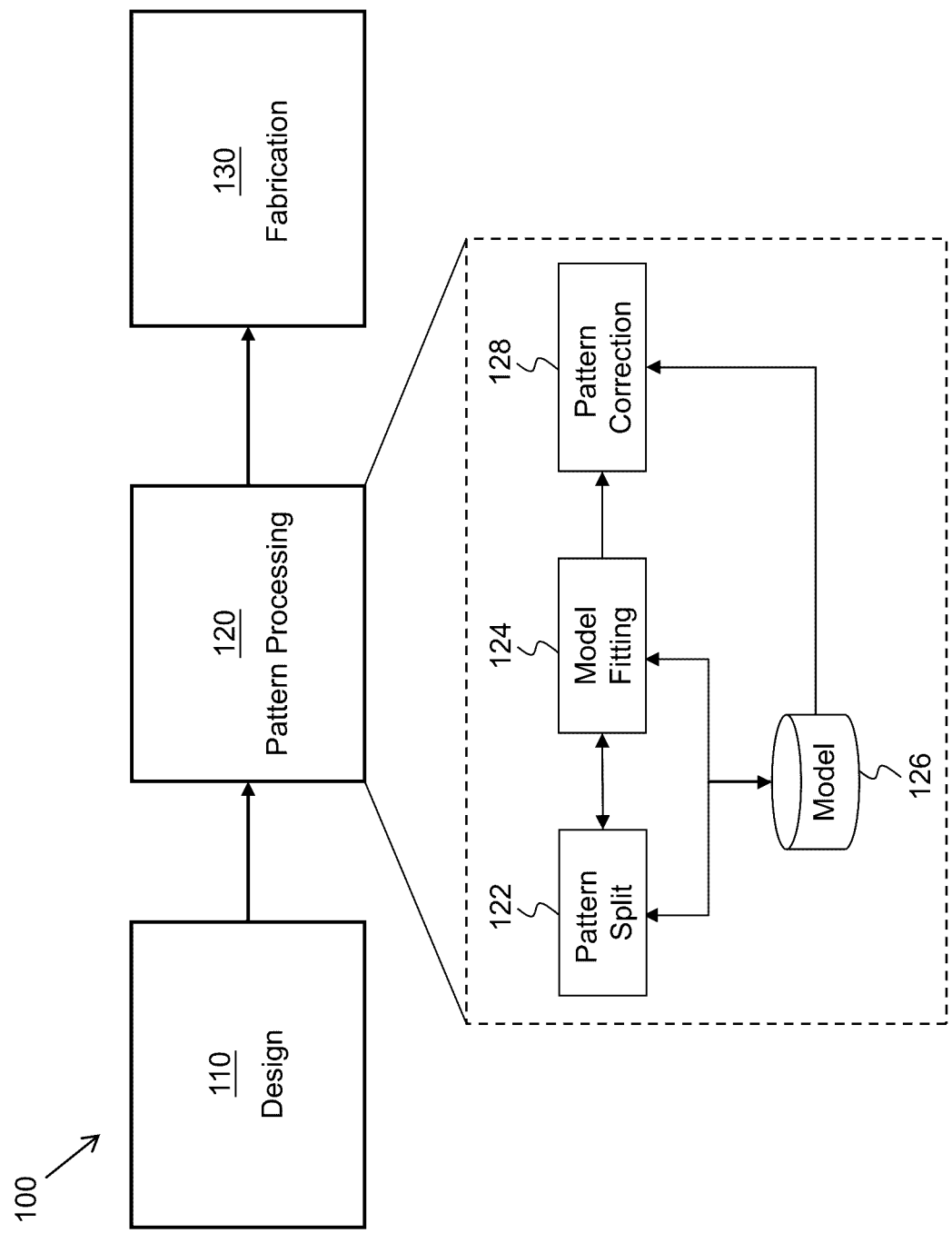
FIG. 1 illustrates a system for performing pattern correction in e-beam lithography according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a system 100 for performing pattern correction in e-beam lithography according to one or more embodiments of the present disclosure. The system 100 includes a design entity 110 that includes one or more computers and storage media for providing an integrated circuit (IC) layout design. The IC layout design may contain a plurality of semiconductor features. The IC layout design may be generated by a computer as a computer file, for example as a graphic database system (GDS) type file or as an open artwork system interchange standard (OASIS) type file. The GDS or OASIS files are database files used for data exchange of IC layout artwork. For example, these files may have binary file formats for representing planar geometric shapes, text labels, as well as other layout information of the IC layout. The GDS or OASIS files may each contain multiple layers. The GDS or OASIS files may be used to reconstruct the IC layout artwork, and as such can be transferred or shared between various fabrication tools.

The design entity 110 provides the IC layout design as a computer file to a pattern processing module 120. In some embodiments, the pattern processing module 120 includes a computer for processing the design data. The computer includes a processor, memory, and input/output with which to perform the steps and operations discussed later in the present disclosure. The pattern processing module 120 can be distributed in various locations, and can physically be included in whole or in part with the design entity 110 or a different facility such as a fabrication facility 130 discussed below. The computer file including the IC layout design may be stored in a computer readable media on the one or more computers. Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

The pattern processing module 120 processes the design data of the IC layout design, and then provides the processing result of such operations to the fabrication facility 130. In the present example, the fabrication facility 130 supports a lithography process to be performed in a semiconductor processing-related facility. The fabrication facility 130 can be a mask-making facility, an engineering facility, or part of a lithography system itself.

Still referring to FIG. 1, the pattern processing module 120 includes a pattern split process 122, a model fitting process 124, and a pattern correction process 128. In some embodiments, the pattern processing module 120 includes an optical proximity correction (OPC) and/or an electron proximity correction (EPC). One or more processes of the pattern separation 122, model fitting 124, and pattern correction 128 may be performed by the processor, memory, and input/output of the computer, and the data files may be stored in the computer readable media.

The pattern split process 122 may include dividing the patterns in the IC layout design into different pattern types. In some embodiments, the patterns may be divided based on the polygon shape of the patterns. FIG. 2A illustrates various exemplary polygon shapes of the patterns 200 according to some embodiments. For examples, a ratio between the length (l) and the width (w) of the square pattern 202 may be in a range from about 0.5:1 to about 1.5:1. A ratio between l and w of the trench pattern 204 may be greater than about 3:1. A ratio between l and w of the slot pattern 206 is in a range from about 2:1 to about 3:1. In some embodiments, the patterns may also be divided based on cell types. For example, one or more memory cell arrays may include repeating structures and may be presented periodically in the patterns, therefore the memory cell arrays with similar structures may be categorized as one pattern type. In some embodiments, the patterns may also be divided based on IP type and/or device type. For example, the patterns included in a static random-access memory (SRAM) may include a plurality of cells and the SRAM be categorized as one pattern type.

In some embodiments, the pattern split process 122 may be performed manually by engineers. For example, the pattern types may be predetermined and marked by different reference marks and/or different computer-aided design (CAD) layers.

In some embodiments, the pattern split process 122 may also be performed automatically by the computer based on the results of the model fitting 124 and/or pattern correction 128 of the IC layout design. For example, all the patterns in the IC layout design may be fitted using one or more models, and the patterns in the IC layout design can then be divided into different pattern types based on the error sensitivity of the fitting results.

After the patterns are split into a plurality of pattern types, a plurality of models 126 may be selected for the plurality of pattern types respectively. In some embodiments, the plurality of models 126 may be selected based on processing and/or manufacturing data from previous e-beam lithography and wafer manufacturing processes. The plurality of models 126 may be used to compensate for image errors, such as those that can arise from diffraction, interference, or other process effects to provide enhanced resolution and precision of the patterns.

Equation (1) illustrates the intensity distribution/Beam Blur (BS) of an electron beam incident on one point (x, y) of a wafer surface using Gaussian approximation:

$$BS = \frac{1}{2\pi\sigma^2} e^{\frac{-(x^2+y^2)}{2\sigma^2}} \quad (1)$$

where $\sigma$ is a scattering coefficient.

Equation (2) is a Point Spread Function (PSF) illustrating the response of the incident electron beam on the surface of the wafer using double Gaussian approximation considering various scattering effects:

$$PSF = \frac{1}{\pi(1+\eta)} \left( \frac{1}{\alpha^2} e^{\frac{-(x^2+y^2)}{\alpha^2}} + \frac{\eta}{\beta^2} e^{\frac{-(x^2+y^2)}{\beta^2}} \right) \quad (2)$$

where $\alpha$ is a forward scattering coefficient, $\beta$ is a backward scattering coefficient, and $\eta$ is related to the ratio between a forwarding scattering component and a backward scattering component. In some embodiments, other factors may also be needed to compensate for the image errors of the incident electron beam on the wafer surface. Those factors may include, for example, acceleration voltage of the electron beam, resist material to be formed on the wafer, pattern types, wafer types, etc. Therefore the PSF may include other forms as expressed in equations (3)-(4) using triple Gaussian approximation or multiple Gaussian approximation, for example:

$$PSF = \frac{1}{\pi(1+\eta+\eta')} \left( \frac{1}{\alpha^2} e^{\frac{-(x^2+y^2)}{\alpha^2}} + \frac{\eta}{\beta^2} e^{\frac{-(x^2+y^2)}{\beta^2}} + \frac{\eta'}{\gamma^2} e^{\frac{-(x^2+y^2)}{\gamma^2}} \right) \quad (3)$$

$$PSF = \frac{1}{\pi(1+\eta+\eta'+\ldots)} \quad (4)$$
$$\left( \frac{1}{\alpha^2} e^{\frac{-(x^2+y^2)}{\alpha^2}} + \frac{\eta}{\beta^2} e^{\frac{-(x^2+y^2)}{\beta^2}} + \frac{\eta'}{\gamma^2} e^{\frac{-(x^2+y^2)}{\gamma^2}} + \ldots \right)$$

where $\alpha$ is a forward scattering coefficient, $\beta$ is a backward scattering coefficient, $\gamma$ is a coefficient related to other factors used to compensate for the image errors, $\eta$, $\eta'$, ... are related to the ratios between the forward scattering component and each Gaussian component respectively. In some embodiments, the PSF equations (2)-(4) may be empirical equations which are determined using the previous e-beam lithography and wafer manufacturing data. It is to be understood that equations (2)-(4) are merely exemplary models and are not intended to be limiting. Other suitable equations may be used to improve the correction of the image errors.

The beam intensity of the incident electron beam considering various scattering effects can be expressed as $PSF_{\textit{eff}}$ in equation (5) as below:

$$PSF_{\textit{eff}}(x, y) = BS \otimes PSF \quad (5)$$
$$= \int \int BS(x-x', y-y') PSF(x', y') dx' dy'$$

The energy intensity distribution function $I(x_i, y_i)$ of the incident electron beam when further considering the surrounding patterns M can be expressed in equation (6) as convolution of the beam blur BS, $PSF_i$ for each pattern type i decided by the pattern split process 122, and pattern type M distributed near the incident electron beam:

$$I(x_i, y_i) = BS \otimes PSF_i \otimes M(x_i, y_i) \quad (6)$$
$$= PSF_{eff,i} \otimes M(x_i, y_i)$$
$$= \int \int PSF_{eff,i}(x_i - x', y_i - y') M(x', y') dx' dy'$$

The plurality of models 126 may take into account various factors, such as scattering effects as shown in equations (1)-(6). In some examples, the plurality of models 126 may further consider aerial image contrast, depth of focus ("DOF"), other suitable factors, or combinations thereof. The plurality of models 126 may also be based on actual processing parameters of the IC manufacturer. The processing parameters may include parameters associated with various processes of the IC manufacturing cycle, parameters associated with tools used for manufacturing the IC, and/or other aspects of the manufacturing process.

The model fitting process 124 may include using the previous e-beam lithography and wafer manufacturing data and the IC design layout data from the design entity 110 to determine a plurality of selected models 126 for the plurality of pattern types respectively. The model fitting process 124 may be performed to the subset of patterns in each pattern type decided in the pattern split process 122 separately. When the errors of the fitting results are within a predetermined range, the selected models 126 may be accurate and can be used in the pattern correction process 128. When the errors of the fitting results are beyond a predetermined range, the selected models 126 may be modified or adjusted in order to receive an improved fitting result. In some examples, when the errors of the fitting results are still beyond a predetermined range after some modification and/or adjustment to the models, the patterns may be re-split into a different group of pattern types, and the models may be re-selected for the model fitting process 124.

After the model fitting process 124, a plurality of models 126 including the coefficients may be determined for the plurality of pattern types respectively. In some examples, the plurality of models 126 may include similar equations used for the plurality of pattern types respectively in the model fitting process 124, but the coefficients, such as $\alpha$, $\beta$, $\eta$, for each pattern type may be determined to be different from one pattern type to another. In some examples, the plurality of models 126 may include different equations such as double Gaussian approximation, triple Gaussian approximation, or suitable multiple Gaussian approximation, used for different pattern types to achieve better fitting results. FIG. 2B illustrates an exemplary table 250 showing coefficients $\alpha$, $\beta$, $\eta$ are decided to be different for respective pattern types. For example, the coefficients $\alpha_{sq}$, $\beta_{sq}$, $\eta_{sq}$ for square pattern 202 may be different from the coefficients $\alpha_{s1}$, $\beta_{s1}$, $\eta_{s1}$ for slot pattern 206.

The pattern correction 128 includes shape correction and/or dose correction. The shape correction may include modifying IC pattern features and adding assist features based on refined models 126 or design rules such that, after a lithography process using the corrected IC design layout, a final pattern on a wafer is improved with enhanced resolution and precision. The shape correction may include e-beam proximity effects corrections, critical dimension (CD) modifications associated with loading effects related to pattern density, and/or geometry modifications. The dose correction may include adjusting the e-beam exposure dose based on refined models 126 such that, various patterns are able to be imaged on the resist layer with higher contrast or increased contrast. When all patterns are written with a same dose, some IC features, especially critical features, do not have enough contrast. The dose correction may be applied only to certain patterns or a subset of the patterns in the IC design layout for increased imaging contrast and imaging resolution. In a particular example, the exposure dose is changed by changing the pixel density of the IC features.

After the model fitting process 124, in some embodiments at the pattern correction process 128, the IC design layout may be first corrected using a rule based correction. The rule based correction may include adding features, such as scattering bars, serif, and/or hammerheads to the IC design layout according to optical models or rules such that, after a lithography process, a final pattern on a wafer is improved with enhanced resolution and precision. Then a simulation process at the pattern correction process 128 is performed to the correct IC layout.

In some embodiments at the pattern correction process 128, the IC design layout may be first corrected using a model based correction, for example, using the determined plurality of models 126 from the model fitting process 124. Then a simulation process at the pattern correction process 128 may be performed to the corrected IC design layout.

In some embodiments at the pattern correction process 128, a simulation process may be first performed to the IC design layout, then the IC design layout is corrected using the plurality of models 126 to the corresponding pattern types.

The simulation process at the pattern correction process 128 may include creating a simulated manufactured device. The simulated manufactured device includes simulated contours of all or a portion of the IC design layout. When the simulated device is not satisfactory in pattern shape and/or dose, the patterns may be further corrected to reduce the errors. In some embodiments, when the simulated device based on the corrected patterns is not satisfactory even after pattern corrections, the plurality of models 126 used for model fitting process 124 may be adjusted, and the model fitting process 124 may be performed again until the simulated device based on the corrected patterns becomes satisfactory. In some embodiments, when the simulated device is not satisfactory even after pattern corrections and model adjustments, the pattern split process 122 may be adjusted to improve the fitting results.

It is to be understood that the pattern split process 122, the model fitting process 124, and the simulation process in pattern correction process 128 may be performed repeatedly in any suitable order to refine the plurality of models 126 until the fitting results are satisfactory. The refined plurality of models 126 may then be used for the pattern correction process 128. After the simulation process, pattern correction 128 may make appropriate corrections to the IC design layout to compensate for the variations or errors associated with the e-beam lithography system (e.g., e-beam system 300 of FIG. 3) to be used in forming the IC design layout on the wafer.

It should be understood that the above description of the pattern processing 120 has been simplified for the purposes of clarity, and the pattern processing 120 may include additional features such as a logic operation (LOP) to modify the IC design layout according to manufacturing rules, and a retarget process (RET) to modify the IC design layout to compensate for limitations in lithographic processes used by IC manufacturer. Additionally, the one or more processes applied to the IC design layout during the pattern processing 120 may be executed in a variety of different orders.

Figure 3:
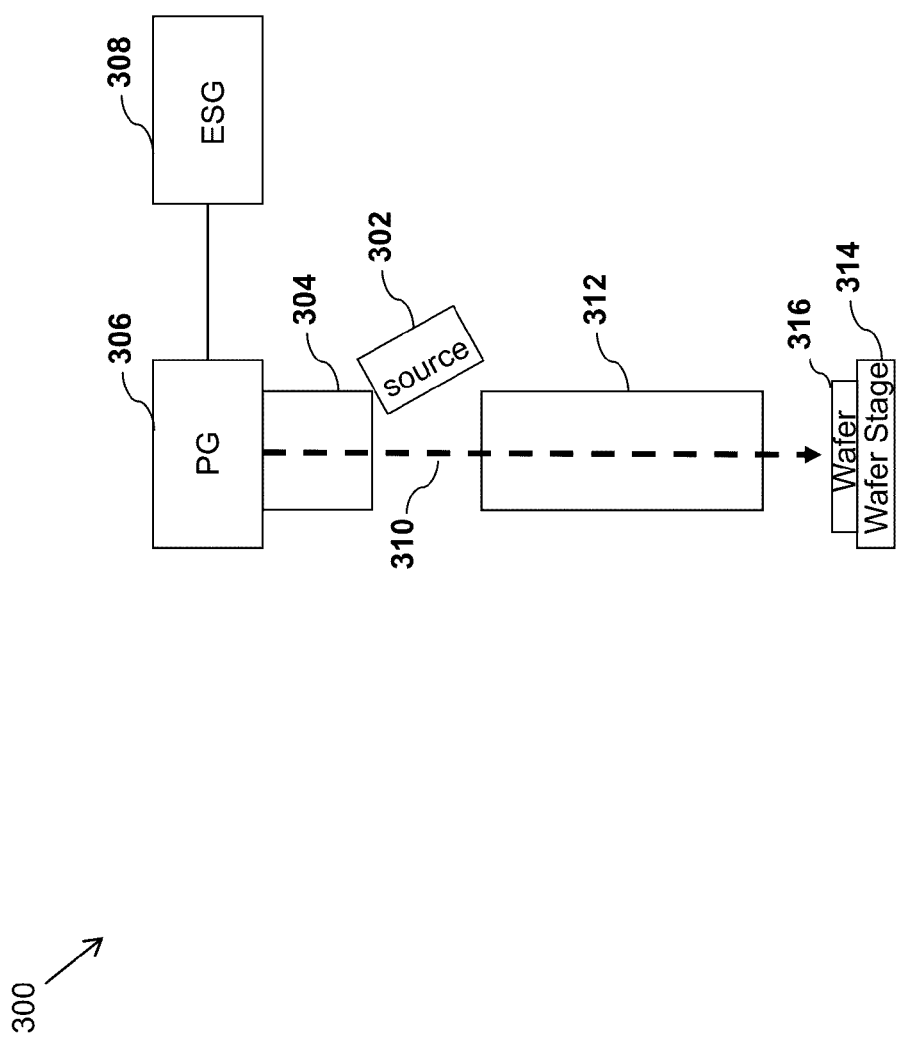
FIG. 3 illustrates a schematic diagram of an electron beam lithography system, in accordance with some embodiments of the present disclosure.

FIG. 3 illustrates a schematic diagram of an electron beam lithography system 300 according to one or more embodiments of the present disclosure. The e-beam lithography system 300 may be included in the fabrication facility 130 of system 100 in FIG. 1. The electron beam lithography system 300 includes a source 302, a condenser lens column 304, a pattern generator (PG) 306, an electric signal generator (ESG) 308, a projection lens column 312, a wafer stage 314, and a wafer 316 disposed on the wafer stage 314. It is understood that other configurations and inclusion or omission of various items in the system 300 may be possible. The system 300 is an example embodiment, and is not intended to limit the present invention beyond what is explicitly recited in the claims.

The source 302 may include an electron source to provide an electron beam. In some embodiments, the source 302 includes a cathode, an anode, and an aperture. The source 302 provides a plurality of electron beams emitted from a conducting material by heating the conducting material to a very high temperature, where the electrons have sufficient energy to overcome a work function barrier and escape from the conducting material (thermionic sources), or by applying an electric field (potential) sufficiently strong that the electrons tunnel through the work function barrier (field emission sources).

The condenser lens column 304 guides the radiation beams from the source 302 to the pattern generator 306. In some embodiments, the radiation beams are parallel to each other after passing through the condenser lens column 304. In some embodiments, the condenser lens column 304 may include a plurality of electromagnetic apertures, electrostatic lenses, and electromagnetic lenses.

The pattern generator 306 is coupled through fiber optics to an electric to optical signal converter that is coupled to the electric signal generator 308 and to the IC design entity 110 and the pattern processing module 120. In some embodiments, the pattern generator 306 may include a mirror array plate, at least one electrode plate disposed over the mirror array plate, and at least one insulator sandwiched between the mirror array plate and the electrode plate or between the electrode plates. The mirror array plate includes a plurality of electric mirrors which are simply static metallic pads of the size between nanometers and micrometers. Each pad constitutes a pixel. The reflectivity of the mirrors is switched on and off by the electric signal from the electric signal generator 308. The electrode plate may include a plurality of lenslets, and the insulator layer may include an insulator. The pattern generator 306 provides patterning radiation beams 310 according to a corrected IC design layout by reflecting or absorbing a radiation beam guided to each lenslet by the condenser lens column 304. The electric signal generator 308 connects to mirrors embedded into the mirror array plate of the pattern generator 306 and to the IC design entity 110 and the pattern processing module 120. The electric signal generator 308 turns mirrors on or off according to the corrected IC design layout by reflecting or absorbing a radiation beam.

The projection lens column 312 guides the patterning radiation beams 310 generated from the pattern generator 36 to the wafer 316 secured on the wafer stage 314. In some embodiments, the projection lens column 312 includes a plurality of electromagnetic apertures, electrostatic lenses, electromagnetic lenses, and deflectors. The wafer stage 314 secures the wafer 316 by electrostatic force and provides accurate movement of the wafer 316 in X, Y and Z directions during focusing, leveling, and exposing the wafer 316 in the electron beam lithography system 300. In some embodiments, the wafer stage 314 includes a plurality of motors, roller guides, and tables.

In some embodiments, a high electric potential is applied between the cathode and the anode at the source 302, which accelerates the electrons towards and through the aperture. The value of the applied electric potential determines the energy level of the electron beams leaving the aperture. The energy of the electron beams reduces as the electron beams travel toward the pattern generator 306. The pixels in the pattern generator 306 are programmed to be substantially zero or a few volts according to the signal from the optical fibers. Those pixels that are substantially zero in voltage receive the incoming electrons from the source 302. The other pixels that carry a negative voltage of a few volts will repel the incoming electrons so that they travel through the optical column 312 towards the wafer 316. The optical column 312 forms an image reduced in size and accelerates the electrons to a voltage that ranges from a few kilo volts to hundreds of kilo volts to reach the wafer 316 secured on the wafer stage 314.

The electron beam lithography system 300 is operated under a high vacuum condition. Therefore, the electron beam lithography system 300 may include one or more vacuum pumps, such as a mechanical pump for a low vacuum and an ion pump for a high vacuum. In some embodiments, the electron beam lithography system 300 may also include a computer with a processor, a memory, and an I/O interface. The computer may be coupled to the source 302, the PG 306, the ESG 308, the wafer stage 114, the IC design entity 110, and/or the pattern processing module 120, for performing one or more of the operations described herein.

Figure 4:
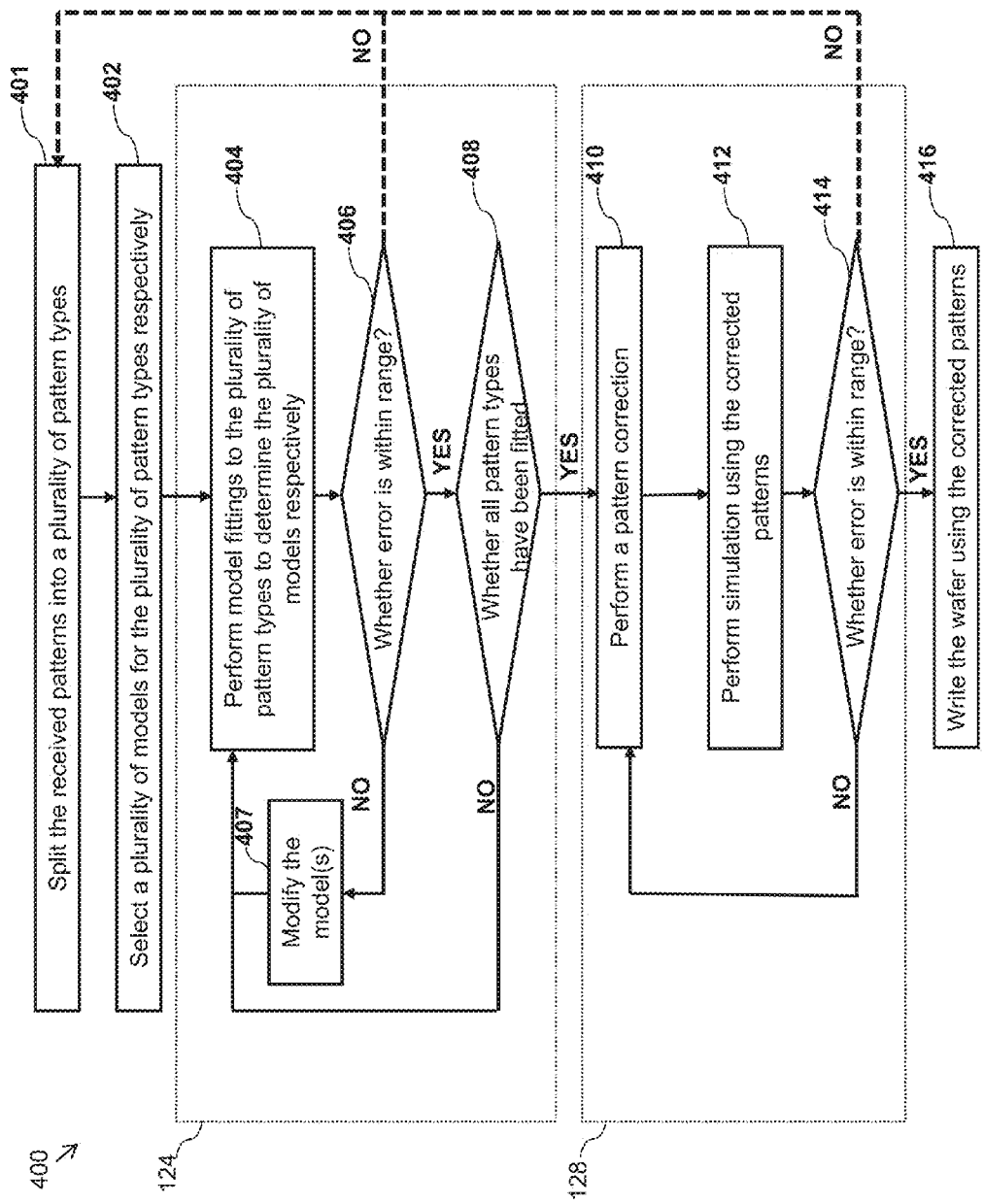
FIG. 4 is a flowchart of a method for performing pattern processing using system of FIG. 1, in accordance with some embodiments of the present disclosure.

FIG. 4 is a flowchart of a method 400 for performing pattern processing using system 100 according to some embodiments of the present disclosure. Method 400 starts from process 401 for splitting a plurality of patterns received from IC design layout into a plurality of pattern types. The plurality of patterns of the IC design layout may be received from the design entity 110 of FIG. 1. The IC design layout is to be processed and used in patterning the one or more material layers on the wafer using the e-beam lithography system 300 of FIG. 3. In various examples, the IC design layout may define STI features, gate electrodes, source/drain features, contact features, metal lines or via features, other suitable features, and combinations thereof. In some examples, the IC design layout may include pattern features with various polygon shapes as shown in FIG. 2A.

At process 401, the plurality of patterns may be split by the pattern split process 122 of the pattern processing module 120. In some embodiments, the plurality of patterns in the IC design layout may be predetermined into different types based on polygon shapes of the patterns as shown in FIG. 2A. The patterns may also be predetermined into different types based on cell type, IP type, and/or device type. The different types of IC patterns may be marked by different reference marks and/or different computer-aided design (CAD) layers prior to perform pattern fitting and correction processes. In some embodiments, the patterns may also be split based on the model fitting results and/or the pattern correction results. For example, when the errors of the model fitting process 124 and/or the simulation of the pattern correction 128 is out of an acceptable range, the patterns may be split based on the error sensitivity associated with model fitting process 124 and/or the simulation of the pattern correction process 128. For example, a subset of pattern features with less fitting error from the pattern fitting may be assigned into a group, and a subset of pattern features with greater fitting error from the pattern fitting may be assigned into another group. The pattern splitting process at process 401 may be performed manually by engineers, or automatically by a computer with a processor.

Method 400 proceeds to process 402 by selecting a plurality of models 126 for the plurality of pattern types respectively. In some embodiments, the plurality of models 126 may be selected based on the e-beam lithography data and the wafer manufacturing data from previous processes. The plurality of models 126 may take into account various factors, such as scattering effects as shown in equations (1)-(6). In some examples, the plurality of models 126 may further consider aerial image contrast, depth of focus ("DOF"), other suitable factors, or combinations thereof. The plurality of models 126 may also be based on actual processing parameters of the IC manufacturer.

Method 400 proceeds to process 404 by performing model fitting process 124 using the plurality of models 126 selected at process 402 for the corresponding pattern types. The model fitting process 404 may be performed using real manufacturing data from previous e-beam lithography process and IC wafer manufacturing process, and the data from the IC design layout received from the design entity 110. As shown in FIG. 4, processes 404, 406, 407, and 408 may be included in the pattern correction process 124.

Method 400 proceeds to process 406 by determining whether the error of the fitting result at process 404 is within a predetermined range. When the fitting error is not within the predetermined range, method 400 proceeds to process 407 by modifying the models. For example, the coefficients of the models for the corresponding pattern types may be adjusted, or models using different equations may be chosen for the corresponding pattern types to reduce the errors of the fitting results. Following process 407, process 404 is performed again to model fittings using the modified models. In some examples, when the error of the fitting result is still out of the predetermined range even after model modifications, process 406 may proceed back to process 401 to re-split the patterns into different plurality of pattern types.

When the fitting error is within the predetermined range, method 400 proceeds to process 408 by determining whether all pattern types have been fitted. When not all pattern types have been fitted, method 400 proceeds back to process 404 to perform model fitting for a pattern type that has not been processed.

In some embodiments, the plurality of models 126 determined at process 124 for different pattern types may include similar equations with different coefficients such as coefficients α, β, η, etc. In some embodiments, the plurality of models 126 determined at process 124 for different pattern types may include different equations such as double Gaussian approximation, triple Gaussian approximation, or suitable multiple Gaussian approximation.

When all the pattern types have been fitted, method 400 proceeds to process 410 by performing a pattern correction to an IC layout. The pattern correction may be the pattern correction process 128 and may be based on the plurality of models determined at model fitting process 124. The pattern correction process 128 may include a simulation process. The pattern correction process 128 may also include a shape and a dose correction. As shown in FIG. 4, processes 410, 412, and 414 may be included in the pattern correction process 128.

Method 400 then proceeds to process 412 by performing a simulation process using the corrected IC layout at process 410. The simulation process may be performed to the corrected patterns of the IC design layout to create a simulated manufactured device.

At process 414, it is determined whether the error of the simulated device is within a predetermined range. When the error of the simulation result is beyond a predetermined range, process 414 proceeds to process 410 to further perform the pattern correction to reduce the simulation errors. In some examples, when the error of the simulation result is still out of the predetermined range even after pattern correction, process 414 may proceed back to process 401 to re-split the patterns into different plurality of pattern types. In some examples, when the error of the simulation result is out of the predetermined range, the plurality of models may also be modified, for example, the coefficients of the models may be modified, or the models may be modified to use a different equation, to reduce the simulation errors.

When the error of the simulation result is within the predetermined range, method 400 proceeds to process 416 by writing the wafer using the corrected patterns. The corrected patterns may be provided to the fabrication facility 130 (e.g., the e-beam lithography system 300) for performing the e-beam exposure process. A typical lithography procedure may include coating, baking, exposure, post-exposure baking, developing and baking according to one embodiment. In some embodiments, a wafer is coated with an e-beam sensitive resist layer. The e-beam exposure process includes exposing the resist layer according to the corrected pattern at process 128 in a raster writing mode (raster mode) or a vector writing mode (vector mode). After the e-beam exposure process, the exposed wafer may then be developed using a developer chemical.

Figure 5:
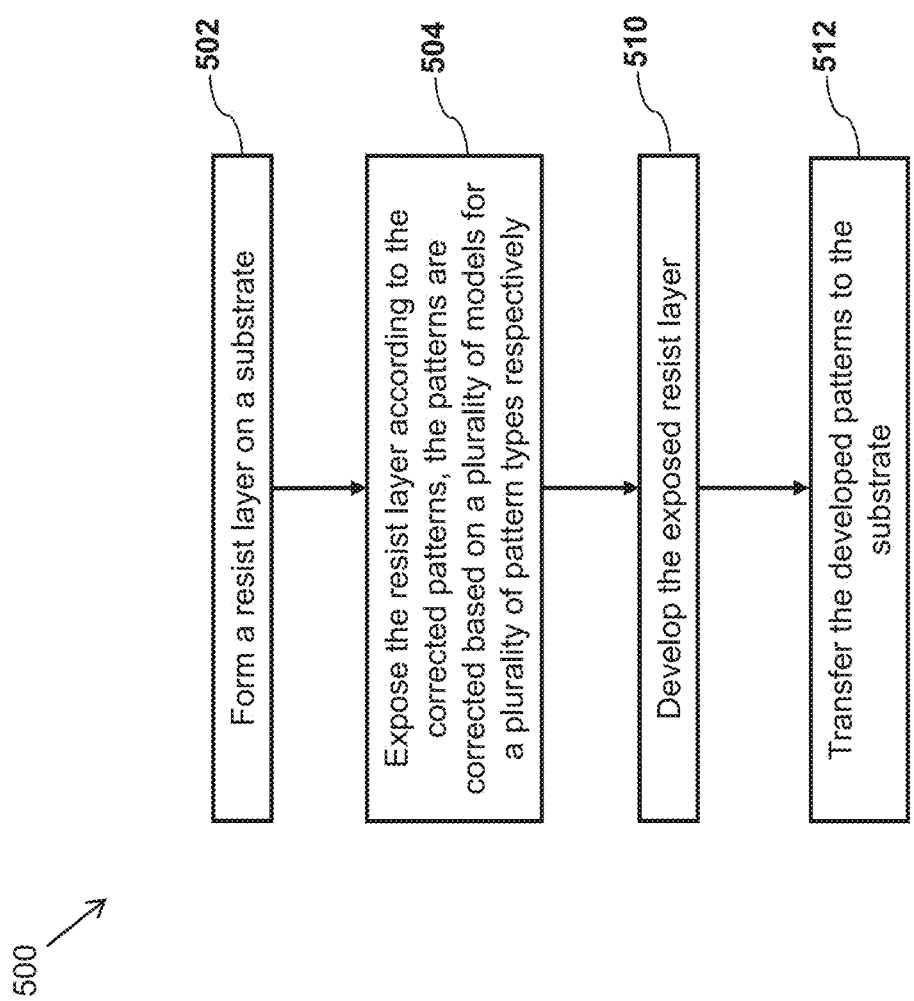
FIG. 5 is a flowchart illustrating a method of forming a pattern on a substrate using the corrected design patterns, in accordance with some embodiments of the present disclosure.

FIG. 5 is a flowchart illustrating a method 500 of forming a pattern on a substrate using e-beam lithography system 300 according to some embodiments. It is understood that additional steps can be provided before, during, and after the method 500, and some steps described can be replaced, eliminated, or moved around for additional embodiments of the method 500.

Method 500 starts from process 502 by forming a resist film on a substrate. In some embodiments, the substrate may include elementary semiconductor, such as silicon, germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. The substrate may also include one or more semiconductor, conductive, and/or insulating features. In some embodiments, the resist layer may include e-beam sensitive resist layer. The resist layer may be a positive resist or a negative resist. The resist layer may include a single layer resist film or a multiple layer resist film. In some embodiments, the resist layer may be deposited on the substrate using a coating process, for example a spin-on process. After the resist layer is deposited, a soft baking (SB) process may be performed.

Method 500 proceeds to step 504 by performing an expose, e.g., e-beam exposure, to the resist layer using the corrected patterns obtained using method 400 of the present disclosure. The patterns may be split into a plurality of pattern types, and a plurality of models may be used to correct the plurality of pattern types respectively as discussed with regard to method 400.

Method 500 proceeds to step 506 by developing the exposed resist layer on the substrate to form a resist pattern. In some embodiments, a developer includes a water based developer, such as tetramethylammonium hydroxide (TMAH), for a positive tone development (PTD). In some embodiments, a developer may include an organic solvent or a mixture of organic solvents, such as methyl a-amyl ketone (MAK) or a mixture involving the MAK, for a negative tome development (NTD). Developer may be applied onto the exposed resist film, for example using a spin-on process. The applied developer may also be performed with a post exposure bake (PEB), a post develop bake (PDB) process, or a combination thereof.

Method 500 proceeds to step 508 by transferring the resist pattern to the substrate. In some embodiments, transferring the resist pattern to the wafer includes performing an etching process to the substrate using the resist pattern as a mask. The etching process may include a dry (plasma) etching, a wet etching, and/or other etching methods.

The present embodiments describe systems and methods for performing pattern processing and correction in an e-beam lithography process. The mechanisms involve a pattern split process and a pattern fitting process performed to each pattern type so that different types of patterns in the IC design layout can be corrected using different models in the pattern correction process to reduce imaging errors. The mechanisms provide an improved pattern processing including pattern split, pattern fitting, and pattern correction to achieve enhanced pattern precisions and imaging resolutions in the IC design layout formed on the wafer using an e-beam lithography system.

The present disclosure provides a method for pattern correction for electron-beam (e-beam) lithography. In accordance with some embodiments, the method includes splitting a plurality of patterns into a plurality of pattern types; performing model fittings to determine a plurality of models for the plurality of pattern types respectively; and performing a pattern correction to an integrated circuit (IC) layout using the plurality of models.

The present disclosure provides a method for electron-beam (e-beam) lithography. In accordance with some embodiments, the method includes forming a resist layer on a substrate; splitting a plurality of patterns of an integrated circuit (IC) layout into a plurality of pattern types; correcting the IC layout using a plurality of models corresponding to the plurality of pattern types respectively to form a corrected IC layout; performing an e-beam exposure process to the resist layer according to the corrected IC layout; and developing the resist layer.

The present disclosure provides a system for pattern correction for electron-beam (e-beam) lithography. In accordance with some embodiments, the system includes a design entity configured to provide an integrated circuit (IC) layout including a plurality of patterns; and a pattern processing module configured to split the plurality of patterns into a plurality of pattern types; and perform pattern corrections to the IC layout using a plurality of models corresponding to the plurality of pattern types respectively to form a corrected IC layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for pattern correction for electron-beam (e-beam) lithography, comprising:
   receiving, by a processor, a computer file including an integrated circuit (IC) layout, the IC layout including a plurality of patterns;
   classifying, by the processor, each pattern of the plurality of patterns according to a plurality of pattern types;
   performing, by the processor, model fittings to determine a plurality of models for the plurality of pattern types respectively, the plurality of models including a first model for a first pattern type and a second model for a second pattern type;
   performing, by the processor, a pattern correction to the integrated circuit (IC) layout using at least the first model and the second model of the plurality of models to generate a corrected IC layout using the first model to correct a first classified pattern and using the second model to correct a second classified pattern, wherein the first and second models are different;
   determining that an error of one of the model fittings is outside a predetermined range;
   modifying a corresponding model and performing another pattern correction using the modified corresponding model;
   providing the corrected IC layout to an e-beam lithography tool, the corrected IC layout including a corrected first classified pattern and a corrected second classified pattern, wherein at least one of the corrected first classified pattern and the corrected second classified pattern is generated using the modified corresponding model; and
   writing the corrected IC layout to an e-beam sensitive resist layer using an e-beam lithography tool.

2. The method of claim 1, wherein the classifying the plurality of patterns includes dividing the plurality of patterns into groups based on one or more pattern types selected from the group consisting of polygon shapes, cell types, IP types, and device types.

3. The method of claim 1, wherein the performing the model fittings includes determining the plurality of models using Gaussian approximations.

4. The method of claim 3, wherein the first model includes a first Gaussian approximation, the first model being performed to the first pattern type including a first subset of patterns,
   wherein the second model includes a second Gaussian approximation, the second model being performed to the second pattern type including a second subset of patterns, and
   wherein the second Gaussian approximation is different from the first Gaussian approximation.

5. The method of claim 4, wherein the first model includes one or more coefficients different from one or more coefficients of the second model.

6. The method of claim 1, further comprising:
   when the error of the model fitting is not within the predetermined range, splitting the plurality of patterns into a plurality of different pattern types.

7. The method of claim 6, wherein the splitting the plurality of patterns includes splitting the plurality of patterns based on error sensitivity.

8. The method of claim 1, wherein the performing the pattern correction includes performing a shape correction process and performing a dose correction process.

9. The method of claim 1, wherein the performing the pattern correction includes performing a simulation process.

10. The method of claim 9, further comprising:
determining whether an error from the simulation process is within a predetermined range.

11. The method of claim 10, further comprising:
when the error from the simulation process is not within a predetermined range, performing the pattern correction to the IC layout.

12. A method for electron-beam (e-beam) lithography, comprising:
forming a resist layer on a substrate;
dividing a plurality of patterns of an integrated circuit (IC) layout according to a plurality of predetermined pattern types;
correcting the IC layout using a plurality of models in which each model corresponds to one of the plurality of predetermined pattern types respectively to form a corrected IC layout, wherein correcting the IC layout further comprises performing shape correction and dose correction by:
determining that an error of one of a plurality of model fittings is outside a predetermined range, and
modifying a corresponding model and performing another pattern correction using the modified corresponding model;
performing an e-beam exposure process to the resist layer according to the corrected IC layout; and
developing the resist layer.

13. The method of claim 12, wherein the plurality of patterns are divided based on length and width dimensions of polygon shapes of the plurality of patterns.

14. The method of claim 12, wherein the plurality of models are determined using Gaussian approximations.

15. A system for pattern correction for electron-beam (e-beam) lithography, comprising:
a beam source configured to provide an electron beam;
a pattern generator;
an electric signal generator; and
a pattern processing module coupled to the pattern generator and configured to:
divide a plurality of patterns of an integrated circuit (IC) layout according to a plurality of pattern types; and
perform pattern corrections to the IC layout using a plurality of models corresponding to the plurality of pattern types, such that each model corresponds to one pattern type, to form a corrected IC layout, wherein each model defines a shape correction and a dose correction to be applied by:
determining that an error of one of a plurality of model fittings is outside a predetermined range, and
modifying a corresponding model and performing another pattern correction using the modified corresponding model.

16. The system of claim 15, wherein the pattern processing module is further configured to:
perform model fittings to the plurality of pattern types to determine the plurality of models corresponding to the plurality of pattern types respectively.

17. The system of claim 15, further comprising:
a mirror array plate in communication with the electric signal generator such that reflectivity of individual mirrors of the mirror array plate is switched by electrical signals from the electric signal generator according to the corrected IC layout.

* * * * *